United States Patent [19]

Tsurumiya et al.

[11] Patent Number: 5,699,235
[45] Date of Patent: Dec. 16, 1997

US005699235A

[54] ELECTRONIC CONTROL BOARD ASSEMBLY INCLUDING EMBEDDED LEAD FRAMES FOR ELECTRICALLY CONNECTING THE CIRCUIT BOARDS OF THE ASSEMBLY

[75] Inventors: Osamu Tsurumiya; Hitoshi Suda, both of Saitama; Kazuyuki Iwasaki; Naofumi Inomata, both of Osaka, all of Japan

[73] Assignee: Honda Giken Kogyo Kabushiki Kaisha, Saitama, Japan

[21] Appl. No.: 507,729

[22] Filed: Jul. 26, 1995

[30] Foreign Application Priority Data

Jul. 26, 1994 [JP] Japan ................... 6-174445

[51] Int. Cl.[6] ................... H01R 9/09; H01R 23/68; H05K 1/14
[52] U.S. Cl. ................... 361/803; 361/796; 361/743; 361/736; 439/74
[58] Field of Search ................... 361/721, 736, 361/743, 744, 749, 790, 791, 796, 803, 784; 439/74, 75, 76.1

[56] References Cited

U.S. PATENT DOCUMENTS

| 3,832,603 | 8/1974 | Cray et al. | 361/790 |
|---|---|---|---|
| 4,858,071 | 8/1989 | Manabe et al. | 361/736 |
| 5,134,546 | 7/1992 | Izumi et al. | 361/796 |
| 5,253,143 | 10/1993 | Klinger et al. | 361/736 |
| 5,501,003 | 3/1996 | Bernstein | 361/784 |

FOREIGN PATENT DOCUMENTS

| 0 271 163 | 12/1987 | European Pat. Off. | |
|---|---|---|---|
| 27 53 145 A1 | 6/1979 | Germany | 361/736 |
| 01-45073 A | 2/1989 | Japan | 439/74 |
| 03-252192 A | 11/1991 | Japan | 439/74 |
| 04-162789 A | 6/1992 | Japan | 439/74 |

Primary Examiner—Leo P. Picard
Assistant Examiner—John B. Vigushin
Attorney, Agent, or Firm—Merchant, Gould, Smith, Edell, Welter & Schmidt P.A.

[57] ABSTRACT

An electronic control board assembly has a large-current control unit and a small-current control unit connected to the large-current control unit. The large-current control unit has an insert-molded board with lead frames embedded therein. The insert-molded board has a first component mounting surface and a first component soldering surface facing away therefrom. A first group of components are mounted on the first component mounting surface and have leads extending through the insert-molded board and soldered to the lead frames. The small-current control unit has a printed wiring board which has a second component mounting surface and a second component soldering surface facing away therefrom. A second group of components are mounted on the second component mounting surface and have leads extending through the printed wiring board and soldered to interconnections patterned on the second component soldering surface. The lead frames have ends extending through the printed wiring board and soldered to the interconnections. The first component soldering surface and the second component soldering surface face outwardly.

10 Claims, 4 Drawing Sheets

ELECTRONIC CONTROL BOARD ASSEMBLY INCLUDING EMBEDDED LEAD FRAMES FOR ELECTRICALLY CONNECTING THE CIRCUIT BOARDS OF THE ASSEMBLY

BACKGROUND OF THE INVENTION

1. Field of the Invention

The present invention relates to an electronic control board assembly which includes installed electronic parts, and more particularly to an electronic control board assembly composed of a large-current control unit having metal conductors of large current handling capability and a small-current control unit having interconnections of small current handling capability.

2. Description of the Related Art

Conventional electronic control board assemblies are shown in FIGS. 4A and 4B of the accompanying drawings.

The electronic control board assembly shown in FIG. 4A has a printed wiring board and a bus bar. Specifically, the electronic control board assembly, generally designated by the reference numeral 30 in FIG. 4A, includes a printed wiring board 31 having interconnections for carrying large and small currents. The interconnections are produced when interconnection patterns are photographically printed on a copper-clad laminated board of glass epoxy by means of a photoresist and then etched or otherwise chemically processed. The printed wiring board 31 supports thereon a bus bar 32A in the form of a metal conductor for carrying large currents, a shunt resistor 32B, a power FET (field-effect transistor) 34 for controlling the large currents flowing through the bus bar 32A, a radial component 33A for handling large currents, an axial component 33B for handling small currents, an IC (integrated circuit) 33C for handling small currents, and a connector 32 for connection to an external circuit. These electronic components supported on the printed wiring board 31 for handling large and small currents are soldered to interconnections on the printed wiring board 31.

The power FET 34 is also mounted on a heat radiator 35 for radiating the heat generated by the power FET 34. The electronic control board assembly 30 also has a case 36 housing the printed wiring board 31 and the electronic components supported thereon. The heat radiator 35 serves as a side wall of the case 36, and the connector 32 is mounted in an opposite side wall of the case 36.

The electronic control board assembly shown in FIG. 4B has an insert-molded board and a printed wiring board. Specifically, the electronic control board assembly, generally designated by the reference numeral 40 in FIG. 4B, includes an insert-molded board 41 molded of a synthetic resin with a lead frame (metal conductor) 42B embedded therein, and a printed wiring board 46 supported on the insert-molded board 41 and having interconnections patterned on a copper-clad laminated board of glass epoxy. The insert-molded board 41 supports thereon a large-current control unit composed of components for handling large currents, which include power FETs 43A, a shunt resistor 42A, and a radial component 43B, soldered to the lead frame 42B. The printed wiring board 46 supports thereon a small-current control unit composed of components for handling small currents, which include a radial component 47A, an axial component 47B, and an IC 47C, soldered to interconnections thereon.

The electronic control board assembly 40 also has a connector 41A for connection to an external circuit and a case housing the printed wiring board 46. The connector 41A is integrally molded as a side wall of the case with the insert-molded board 41, and other side walls of the case are also integrally molded with the insert-molded board 41. The printed wiring board 46 is fixedly mounted on and spaced from the insert-molded board 41 by a plurality of posts 45. The case includes a heat radiator 44 covering one side of the insert-molded board 41 and holding the power FETs 43A, and a cover 48 covering one side of the printed wiring board 46.

The electronic control board assembly 30 shown in FIG. 4A is relatively expensive to manufacture because the bus bar 32A, which is of a complex structure, inhibits the various electronic components from being automatically installed on the printed wiring board 31. Since the bus bar 32A takes up too a large space to install other electronic components in a compact fashion, the electronic control board assembly 30 is necessarily large in size.

The electronic control board assembly 40 shown in FIG. 4B also therefor suffers problems. Specifically, connections between the insert-molded board 41 and the printed wiring board 46 make it difficult to mass-produce the electronic control board assembly 40. As shown in FIG. 4B, the insert-molded board 41 has an integrally molded portion extending to the printed wiring board 46 for soldered connection between the lead frame 42B and the interconnections on the printed wiring board 46. However, the lead frame 42B and the interconnections on the printed wiring board 46 have to be manually soldered to each other because it is very difficult to automatically solder them due to structural limitations. While the electronic components can automatically be soldered to interconnections on the printed wiring board 46, the electronic components cannot easily automatically be soldered to the lead frame 42B because of a masking which is required to prevent the solder from being applied to leads connecting the insert-molded board 41 to the printed wiring board 46 and also because of soldering defects, such as soldering failures and solder-joint voids, which tend to result from an insufficient solder flow in a solder bath that is caused by the molded side walls of the case which serve as barriers.

As described above, the conventional electronic control board assemblies which require manual assembling and soldering processes for their production my be manufactured efficiently in small quantities, but cannot be mass-produced on an automatic basis.

SUMMARY OF THE INVENTION

It is therefore an object of the present invention to provide an electronic control board assembly which can automatically be mass-produced through automatic assembling and soldering processes.

According to the present invention, there is provided an electronic control board assembly comprising a large-current control unit having an insert-molded board with lead frames embedded therein, the insert-molded board having a first component mounting surface and a first component soldering surface facing away from the first component mounting surface, and a first group of components mounted on the first component mounting surface and having leads extending through the insert-molded board and soldered to the lead frames; and a small-current control unit connected to the large-current control unit, the small-current control unit having a printed wiring board, the printed wiring board having a second component mounting surface and a second component soldering surface facing away from the second component mounting surface, interconnections patterned on the second component soldering surface, and a second group of components mounted on the second component mounting surface and having leads extending through the printed wiring board and soldered to the interconnections, the lead frames having ends extending through the printed wiring board and soldered to the interconnections, the first component soldering surface and the second component soldering surface facing outwardly.

According to the present invention, there is also provided an electronic control board assembly comprising an insert-molded board with lead frames embedded therein, the insert-molded board having a first component mounting surface and a first component soldering surface facing away from the first component mounting surface, a first group of components mounted on the first component mounting surface and having leads extending through the insert-molded board and soldered to the lead frames, a printed wiring board connected to the insert-molded board, the printed wiring board having a second component mounting surface and a second component soldering surface facing away from the second component mounting surface and supporting interconnections patterned thereon, and a second group of components mounted on the second component mounting surface and having leads extending through the printed wiring board and soldered to the interconnections, the lead frames having ends extending through the printed wiring board and soldered to the interconnections, the first component soldering surface and the second component soldering surface facing outwardly.

The first component mounting surface and the second component mounting surface may face each other. The first component mounting surface and the second component mounting surface maybe spaced from each other, and the first group of components and the second group of components may be positioned between the first component mounting surface and the second component mounting surface.

The first component soldering surface and the second component soldering surface my lie flush with each other and face in one direction.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
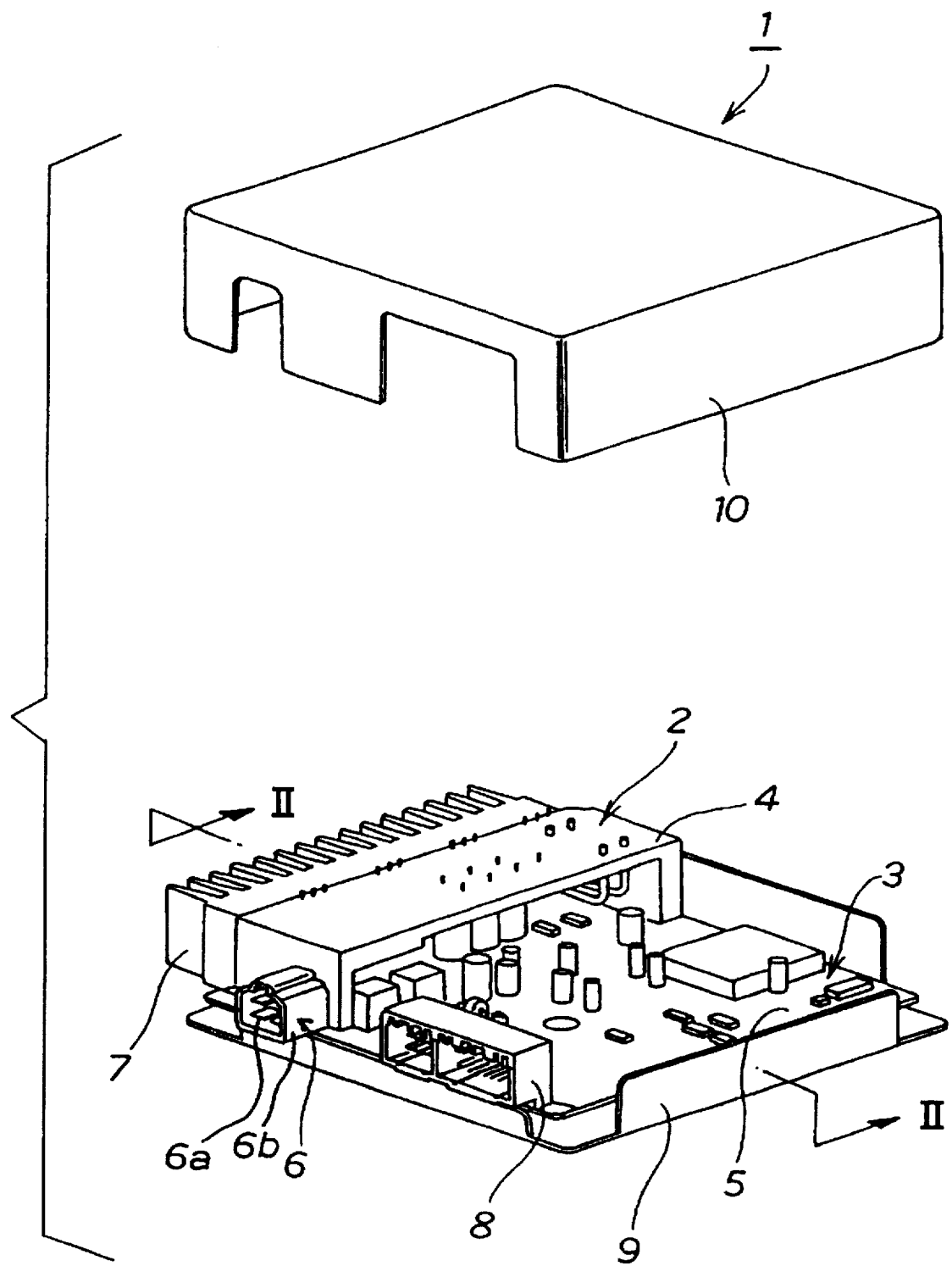
FIG. 1 is an exploded perspective view of an electronic control board assembly according to an embodiment of the present invention.
Figure 2:
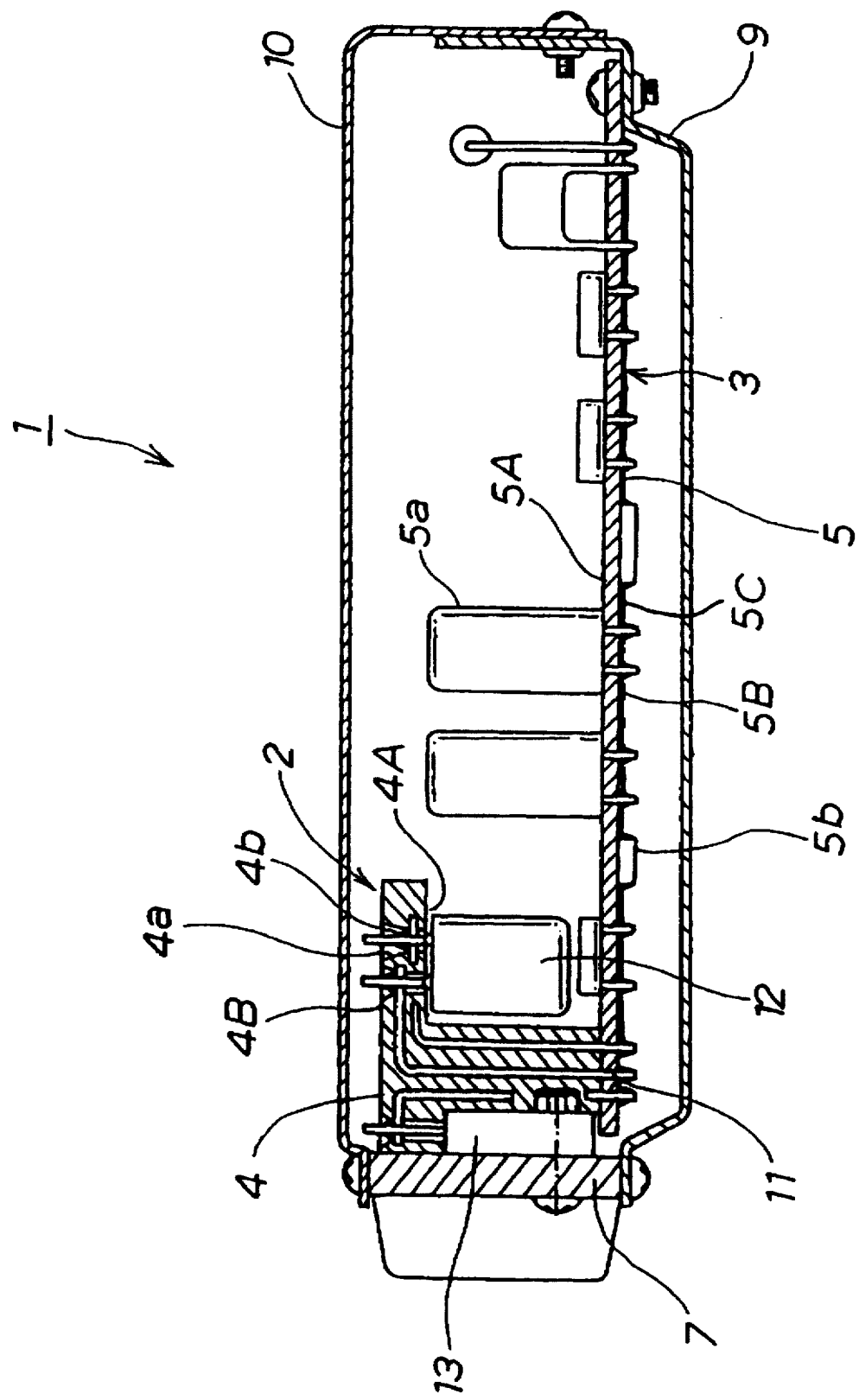
FIG. 2 is a cross-sectional view taken along line II—II of FIG. 1.

As shown in FIGS. 1 and 2, an electronic control board assembly 1 according to an embodiment of the present invention comprises a large-current control unit 2 having an insert-molded board 4 with lead frames 11 embedded therein and electronic components for handling large currents, such as leaded components 12, power FETs 13, etc., which are supported on the insert-molded board 4, and a small-current control unit 3 having a printed wiring board 5 and electronic components for handling small currents, such as leaded components 5a, chip components 5b, etc., which are supported on the printed wiring board 5. The electronic control board assembly 1 also has a case assembly comprising a lower case 9 and an upper case 10 which jointly house the large-current control unit 2 and the small-current control unit 3 therein. The case assembly also includes a heat sink 7 which serves as a side wall thereof and supports the power FETs 13 for absorbing heat generated by the power FETs 13. For assembling the electronic control board assembly 1, the large-current control unit 2 and the small-current control unit 3 are electrically connected to each other, and thereafter they are fixed to the lower case 9 and the heat sink 7, and then covered with the upper case 10. The assembled electronic control board assembly 1 serves as a functional block.

The insert-molded board 4 is integrally molded of a synthetic resin such as a liquid crystal polymer with the lead frames 11, each in the form of a metal conductor of large current handling capability, embedded therein. The insert-molded board 4 is molded to a three-dimensional shape necessary to provide wiring patterns suitable for electric connection to the electronic components for handling large currents.

The insert-molded board 4 has a component mounting surface 4A on which electronic components for handling large currents are mounted, and a component soldering surface 4B to which the mounted electronic components soldered. The insert-molded board 4 also has component attachment holes 4a defined therein from the component mounting surface 4A to the component soldering surface 4B through the lead frames 11. The leaded components 12, the power FETs 13, and other components are mounted on the component mounting surface 4A and have leads inserted from the component mounting surface 4A into the component attachment holes 4a and having ends projecting from the component soldering surface 4B. The leads are soldered to the lead frames 11 by solder pastes 4b that are introduced from the component soldering surface 4B. The component soldering surface 4B is a flat surface which allows the leads of the leaded components 12, the power FETs 13, and other components to be soldered to the lead frames 11 from the same component soldering surface 4B. Before the upper case 10 is attached, the component soldering surface 4B faces outwardly for facilitating the soldering of the leads of the leaded components 12, the power FETs 13, and other components.

The insert-molded board 4 further includes an integral power connector 6 for handling large currents which includes connector terminals 6a projecting from the lead frames 11 and surrounded by a cover 6b integrally molded of a synthetic resin with the insert-molded board 4 at one end thereof. Since the power connector 6 is integral with the insert-molded board 4, the number of parts of the large-current control unit 2 is relatively small.

The printed wiring board 5 has a component mounting surface 5A on which electronic components for handling small currents are mounted, and a component soldering surface 5B to which the mounted electronic components soldered. The component soldering surface 5B has interconnections 5C patterned on a copper-clad leafed board of glass epoxy. Specifically, the leaded components 5a are mounted on the component mounting surface 5A and have leads extending through component attachment holes defined in the printed wiring board 5 and projecting from the component soldering surface 5B where they are soldered to interconnections 5C on the component soldering surface 5B. The chip components (surface-mountable components) 5b are mounted on the component soldering surface 5B and soldered to interconnections 5C thereon. The interconnections 5C on the component soldering surface 5B are electrically connected to a connector 8 (see FIG. 1) mounted on an end of the printed wiring board 5. Before the lower case 9 is attached, the component soldering surface 5B faces outwardly for facilitating the soldering of the leads of the leaded components 5a and the chip components 5b.

The lead frames 11 embedded in the insert-molded board 4 have ends projecting from its surface held in contact with the component mounting surface 5A of the printed wiring board 5. The projecting ends of the lead frames 11 are inserted from the component mounting surface 5A through the printed wiring board 5, and project from the component soldering surface 5B where they are soldered to interconnections 5C thereon. Therefore, the insert-molded board 4 and the printed wiring board 5 are electrically connected to each other without need for separate wiring elements. When the insert-molded board 4 is mounted on the printed wiring board 5, the component mounting surfaces 4A, 5A face inwardly toward each other in spaced-apart relation, providing a space between the insert-molded board 4 and the printed wiring board 5 for installing various components therebetween.

The soldering process on the insert-molded board 4 and the printed wiring board 5 will be described in detail below.

On the insert-molded board 4, the leads of the leaded components 12, the power FETs 13, and other components are inserted from the component mounting surface 4A into the component attachment holes 4a and temporarily secured in place with the lead ends projecting from the component soldering surface 4B. Then, the leads are automatically soldered to the lead frames 11 when the component soldering surface 4B is passed through a solder bath. At this time, the power FETs 13 are temporarily fixed to a holder jig, rather khan the heat sink 7, because it would not be possible to pass the power FETs 13 through the solder bath if it were fixed to the heat sink 7. The power FETs 13 are subsequently fixed to the heat sink 7 when the electronic control board assembly 1 is finally assembled.

On the printed wiring board 5, the leads of the leaded components 5a are inserted from the component mounting surface 5A into the component attachment holes and temporarily secured in place with the lead ends projecting from the component soldering surface 5B. The chip components 5b are bonded to the component soldering surface 5B by an adhesive. The insert-molded board 4 is mounted on the component mounting surface 5A with the projecting ends of the lead frames 11 being inserted through the component attachment holes in the printed wiring board 5 and projecting from the component soldering surface 5B. The insert-molded board 4 mounted on the component mounting surface 5A is supported by a support jig. Thereafter, the leads of the leaded components 5a and the chip components 5b and the projecting ends of the lead frames 11 are automatically soldered to the interconnections 5C on the component soldering surface 5B when the component soldering surface 5B is passed through a solder bath.

Since the component soldering surfaces 4B, 5B of the insert-molded board 4 and the printed wiring board 5, respectively, face outwardly away from each other at the time they are put together, the leads of the various components can automatically be soldered on the component soldering surfaces 4B, 5B to electrically connect the insert-molded board 4 and the printed wiring board 5 to each other without need for special separate wiring elements. Therefore, the electronic control board assembly 1 can be mass-produced efficiently through automatic assembling and soldering processes.

Inasmuch the component mounting surfaces 4A, 5A of the insert-molded board 4 and the printed wiring board 5, respectively, face inwardly toward each other and are spaced from each other, a space is created between the insert-molded board 4 and the printed wiring board 5 for installing various components on both the boards 4, 5, such as the leaded components 12, 5a, therein. Consequently, the electronic control board assembly 1 can be arranged in a relatively compact configuration.

Figure 3:
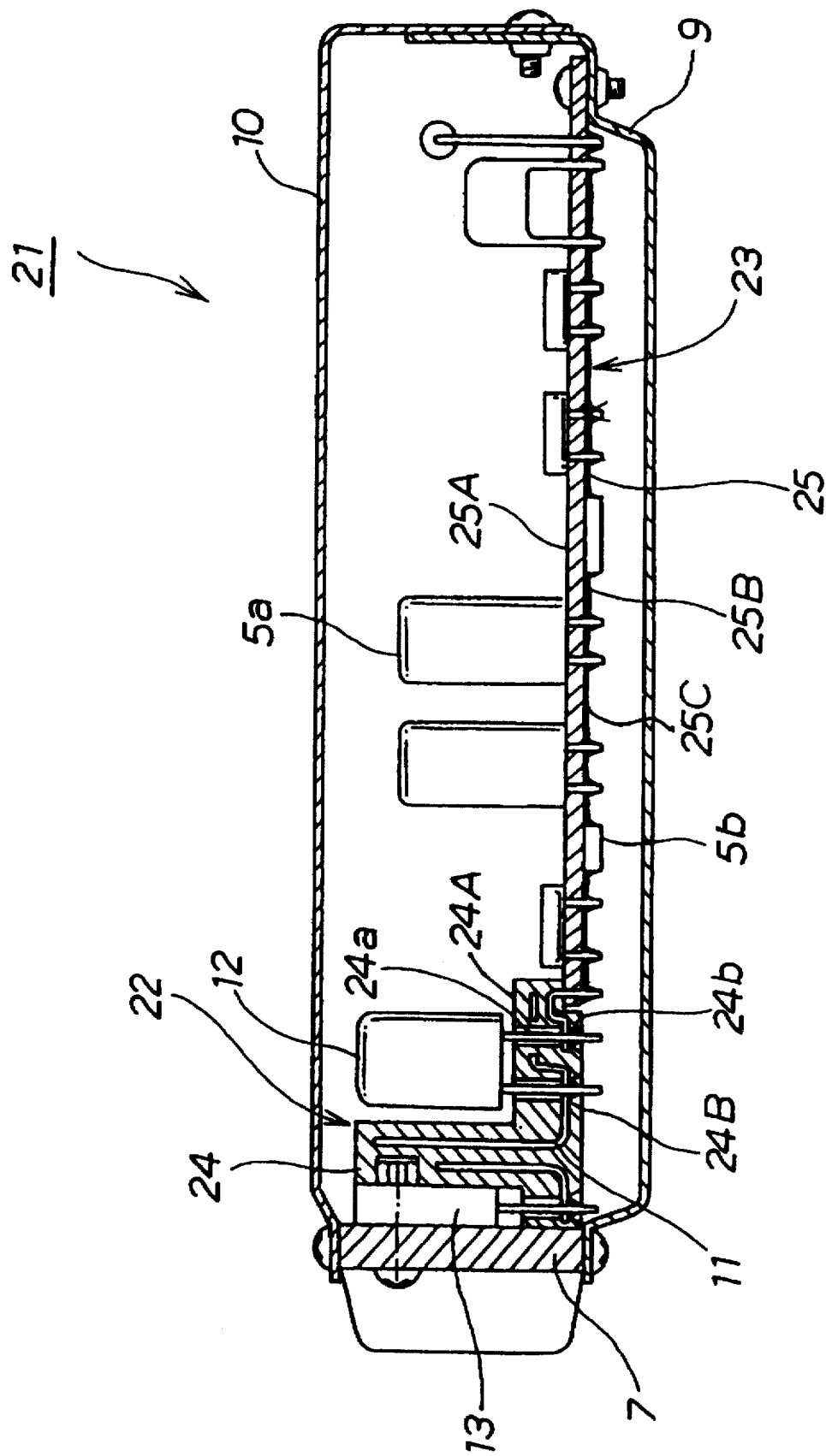
FIG. 3 is a cross-sectional view, corresponding to FIG. 2, of an electronic control board assembly according to another embodiment of the present invention.
Figure 4A:
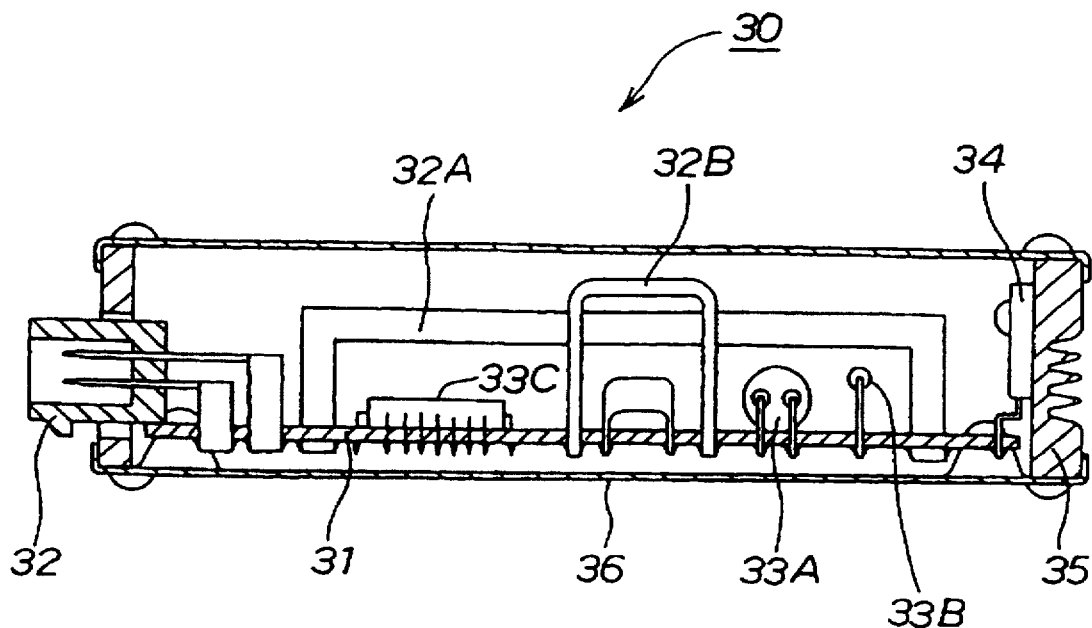
FIG. 4A is a cross-sectional view of a conventional electronic control board assembly.
Figure 4B:
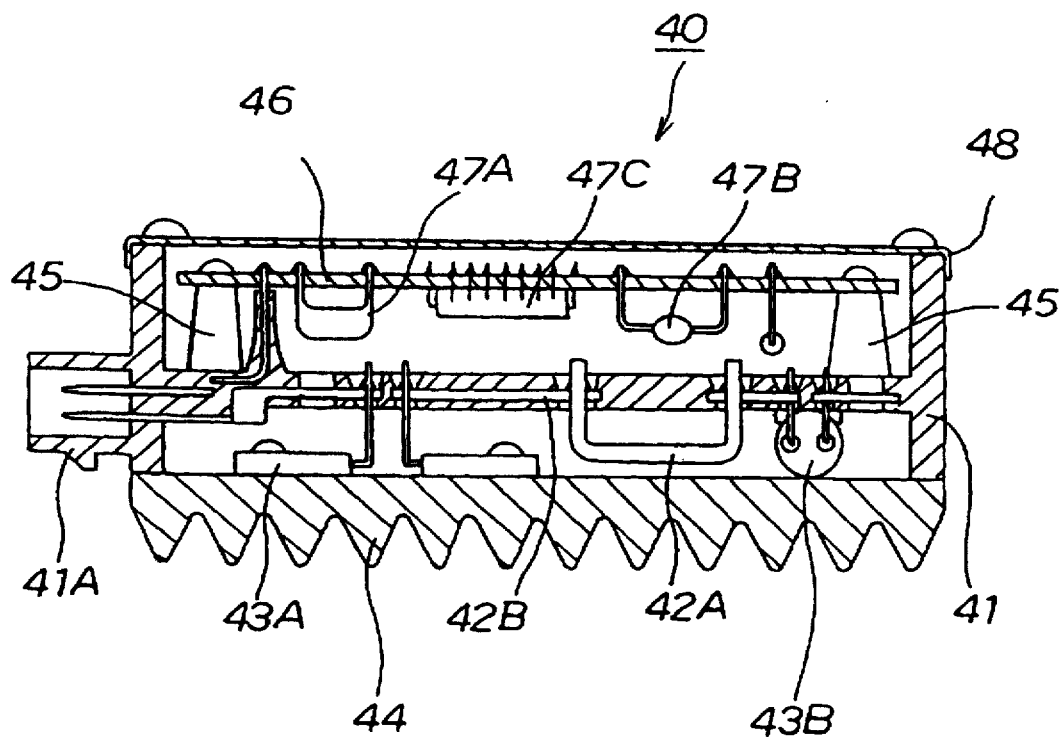
FIG. 4B is a cross-sectional view of another conventional electronic control board assembly.

FIG. 3 shows in cross section an electronic control board assembly 21 according to another embodiment of the present invention.

The electronic control board assembly 21 comprises a large-current control unit 22 having an insert-molded board 24 and a small-current control unit 23 having a printed wiring board 25. The insert-molded board 24 has a component mounting surface 24A and a component soldering surface 24B, and the printed wiring board 25 has a component mounting surface 25A and a component soldering surface 25B which faces in the same direction as, and lies flush with, the component soldering surface 24B of the insert-molded board 24. The component mounting surfaces 24A, 25A face in the same direction.

The electronic control board assembly 21 is assembled as follows:

The leads of leaded components 12, power FETs 13, and other components are inserted from the component mounting surface 24A into component attachment holes 24a in the insert-molded board 24 and temporarily secured in place with the lead ends projecting from the component soldering surface 24B. After the power FETs 13 are temporarily fixed to a holder jig, lead frames 11 in the insert-molded board 24 are temporarily connected to the printed wiring board 25 on which leaded components 5a, chip components 5b, and other components have been fixedly mounted.

Then, the insert-molded board 24 and the printed wiring board 25 are fixed to each other by a soldering jig, and the component soldering surfaces 24B, 25B are adjusted so as to lie flush with each other. Thereafter, the component soldering surfaces 24B, 25B are passed through a solder bath, thereby automatically soldering the leads of the leaded components 12, power FETs 13, and other components to the lead frames 11 and also the leads of the leaded components 5a, chip components 5b, and other components to interconnections 25C on the printed wiring board 25.

Subsequently, the power FETs 13 are attached to a heat sink 7, and the insert-molded board 24 and the printed wiring board 25 are fastened to a lower case 9. Then, the insert-molded board 24 and the printed wiring board 25 are covered with an upper case 10. The electronic control board assembly 21 is now completed.

Because the component soldering surfaces 24B, 25B of the insert-molded board 24 and the printed wiring board 25 lie flush with each other, the leads of the various components can be soldered to the lead frames 11 and the interconnections and also the boards 24, 25 can be soldered or electrically connected to each other simply by passing the component soldering surfaces 24B, 25B through a solder bath only once. Therefore, the electronic control board assembly 21 can be mass-produced efficiently through automatic assembling and soldering processes.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

What is claimed is:

1. An electronic control board assembly comprising:

a large-current control unit having an insert-molded board with lead frames embedded therein, said insert-molded board having a first component mounting surface and a first component soldering surface facing away from said first component mounting surface, and a first group of components mounted on said first component mounting surface and having leads extending through said insert-molded board and soldered to said lead frames; and a small-current control unit connected to said large-current control unit, said small-current control unit having a printed wiring board, said printed wiring board having a second component mounting surface and a second component soldering surface facing away from said second component mounting surface, interconnections patterned on said second component soldering surface, and a second group of components mounted on said second component mounting surface and having leads extending through said printed wiring board and soldered to said interconnections, said lead frames having ends extending through said printed wiring board and soldered to said interconnections, said first component soldering surface and said second component soldering surface facing outwardly.

2. An electronic control board assembly according to claim 1, wherein said first component mounting surface and said second component mounting surface face each other.

3. An electronic control board assembly according to claim 2, wherein said first component mounting surface and said second component mounting surface are spaced from each other, said first group of components and said second group of components being positioned between said first component mounting surface and said second component mounting surface.

4. An electronic control board assembly according to claim 1, wherein said first component soldering surface and said second component soldering surface lie flush with each other.

5. An electronic control board assembly according to claim 4, wherein said first component soldering surface and said second component soldering surface face in one direction.

6. An electronic control board assembly comprising:

an insert-molded board with lead frames embedded therein, said insert-molded board having a first component mounting surface and a first component soldering surface facing away from said first component mounting surface;

a first group of components mounted on said first component mounting surface and having leads extending through said insert-molded board and soldered to said lead frames;

a printed wiring board connected to said insert-molded board, said printed wiring board having a second component mounting surface and a second component soldering surface facing away from said second component mounting surface and supporting interconnections patterned thereon; and a second group of components mounted on said second component mounting surface and having leads extending through said printed wiring board and soldered to said interconnections, said lead frames having ends extending through said printed wiring board and soldered to said interconnections, said first component soldering surface and said second component soldering surface facing outwardly.

7. An electronic control board assembly according to claim 6, wherein said first component mounting surface and said second component mounting surface face each other.

8. An electronic control board assembly according to claim 7, wherein said first component mounting surface and said second component mounting surface are spaced from each other, said first group of components and said second group of components being positioned between said first component mounting surface and said second component mounting surface.

9. An electronic control board assembly according to claim 6, wherein said first component soldering surface and said second component soldering surface lie flush with each other.

10. An electronic control board assembly according to claim 9, wherein said first component soldering surface and said second component soldering surface face in one direction.

* * * * *

UNITED STATES PATENT AND TRADEMARK OFFICE
CERTIFICATE OF CORRECTION

PATENT NO. : 5,699,235

DATED : DECEMBER 16, 1997

INVENTOR(S) : TSURUMIYA ET AL.

It is certified that error appears in the above-identified patent and that said Letters Patent is hereby corrected as shown below:

Title page, [73] Assignee: please add --NEC Home Electronics, Ltd. Osaka, Japan-- after "Honda Giken Kogyo Kabushiki Kaisha, Saitama, Japan"

Col. 2, line 20: delete "therefor" before the word "suffers"

Col. 5, line 42: "khan" should read --than--

Signed and Sealed this

Eighteenth Day of January, 2000

Attest:

Q. TODD DICKINSON

*Attesting Officer*  *Commissioner of Patents and Trademarks*